(12) United States Patent
Bennett et al.

(10) Patent No.: US 6,294,102 B1
(45) Date of Patent: Sep. 25, 2001

(54) SELECTIVE DRY ETCH OF A DIELECTRIC FILM

(75) Inventors: Delores A. Bennett, Poughkeepsie; James P. Norum, Mt. Kisco; Hongwen Yan, Somers; Chienfan Yu, Orange, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/305,432

(22) Filed: May 5, 1999

(51) Int. Cl.$^7$ .................................................. H01L 21/311
(52) U.S. Cl. ............................... 216/37; 216/67; 216/72; 216/79; 438/695; 438/723; 438/724
(58) Field of Search .................................. 216/37, 67, 72, 216/79; 438/694, 695, 723, 740, 743

(56) References Cited

U.S. PATENT DOCUMENTS

| 5,423,945 | 6/1995 | Marks et al. ....................... 156/662.1 |
| 5,801,094 | * 9/1998 | Yew et al. ............................. 438/624 |
| 6,143,665 | * 11/2000 | Hsieh ................................... 438/710 |

* cited by examiner

*Primary Examiner*—Randy Gulakowski
*Assistant Examiner*—Allan Olsen
(74) *Attorney, Agent, or Firm*—Ratner & Prestia; Tiffany L. Townsend, Esq.

(57) ABSTRACT

A process of etching an oxide layer placed over a nitride layer of a substrate with high selectivity. The process comprises plasma etching the oxide layer of the substrate with a carbon and fluorine-containing gas and with a nitrogen-containing gas. A $Si_xN_y$ species is formed which is deposited on the nitride layer substantially in equilibrium with etching of the nitride layer.

18 Claims, 1 Drawing Sheet

SELECTIVE DRY ETCH OF A DIELECTRIC FILM

TECHNICAL FIELD

The present invention relates generally to a process for etching a dielectric film and, more specifically, to a process for etching an oxide layer over a nitride layer with high selectivity.

BACKGROUND OF THE INVENTION

A significant challenge in semiconductor fabrication is to etch away an oxide layer, or a portion of the oxide layer, which has been placed over a nitride layer such as silicon nitride. The challenge is to perform the etch with high selectivity for the oxide layer. Because both oxide and nitride materials generally etch at about the same rate in an etch plasma, the challenge of providing a process with sufficient selectivity has not been met.

One attempt to meet this challenge uses a fluorine-substituted hydrocarbon as an etchant. The fluorine reacts with the carbon present to form a passivating coating of a carbon-fluorine polymer over the substrate. This polymer is dissociated by oxygen atoms formed during the etch of the oxide layer. Thus, as the oxide layer is continually etched, the nitride layer etches at a much slower rate due to the presence of the passivating coating. Unfortunately, the passivating layer is also attacked by free fluorine atoms present in the plasma and, as a result, etching of the nitride layer continues at a rate greater than desired.

Marks et al. disclose, in U.S. Pat. No. 5,423,945, another process for selectively etching an oxide layer over a nitride layer. The disclosed process uses highly polymerizing gases, such as $C_4F_8$ or $CH_2F_2$, with a fluorine scavenger, such as CO, to form a protective carbon-rich polymer layer on the nitride layer surface. Although enhanced etch selectivity of the oxide layer to the nitride layer is achieved, several drawbacks occur using this process.

First, the process disclosed by Marks et al. requires the buildup of polymer on the nitride layer surface to slow down the etch rate on the nitride layer. This process is not ideal for very thin nitride layers of 200 angstroms or less because the nitride layer may be consumed by etching before the selectivity effect is achieved. Second, the use of a polymerizing gas is not desirable because its high selectivity is likely to perpetuate defects during subsequent etching of the nitride layer, a step conventionally conducted in semiconductor processing.

In addition, highly polymerizing gases tend to leave substantial residue both on the substrate being etched and in the process chamber. As a result of this residue, both the substrate and the process chamber typically require a post-process clean. Furthermore, many polymerizing gases, including $CH_2F_2$, are flammable, toxic, or both flammable and toxic. Similarly, CO, which is used as a scavenger gas, is toxic and tends to leach nickel and iron from stainless steel components in the gas line of the etching chamber apparatus.

The deficiencies of the use of conventional processes for etching an oxide layer over a nitride layer show that a need exists for a process that has a high selectivity for the oxide layer, uses non-polymerizing gases, and is suitable for use on an oxide layer disposed on a thin nitride layer. To overcome the shortcomings of conventional processes, a new process is provided. An object of the present invention is to provide a process for etching an oxide layer over a nitride layer with high selectivity. A related object is to provide a process suitable for oxide layers disposed on thin nitride layers. Still another object of the present invention is to provide a process that uses non-polymerizing gases.

SUMMARY OF THE INVENTION

To achieve these and other objects, and in view of its purposes, the present invention provides a process for etching an oxide layer over a nitride layer in an upper portion of a substrate. The substrate is etched with high selectivity for the oxide layer over the nitride layer using a plasma derived from a carbon and fluorine-containing gas and from a nitrogen-containing gas. Etching of the substrate through the oxide layer to the nitride layer produces a SixNy species which is deposited on the nitride layer substantially in equilibrium with etching of the nitride layer.

Preferably, the carbon and fluorine-containing gas is $CF_4$, $C_2F_6$, or a combination of those compounds. The nitrogen-containing gas is preferably $N_2$, $NH_3$, or a combination of those compounds. The nitride layer disposed beneath the oxide layer is preferably a nitride layer which was formed by chemical vapor deposition (CVD), such as low pressure chemical vapor deposition (LPCVD) or plasma enhanced chemical vapor deposition (PECVD). More preferably, the nitride layer is formed by plasma enhanced chemical vapor deposition.

It is to be understood that both the foregoing general description and the following detailed description are exemplary, but are not restrictive, of the invention.

BRIEF DESCRIPTION OF THE FIGURE

The invention is best understood from the following detailed description when read in connection with the accompanying FIGURE. It is emphasized that, according to common practice, the various features of the FIGURE are not to scale. On the contrary, the dimensions of the various features are arbitrarily expanded or reduced for clarity. The only FIGURE.

DETAILED DESCRIPTION OF THE INVENTION

Figure 1:
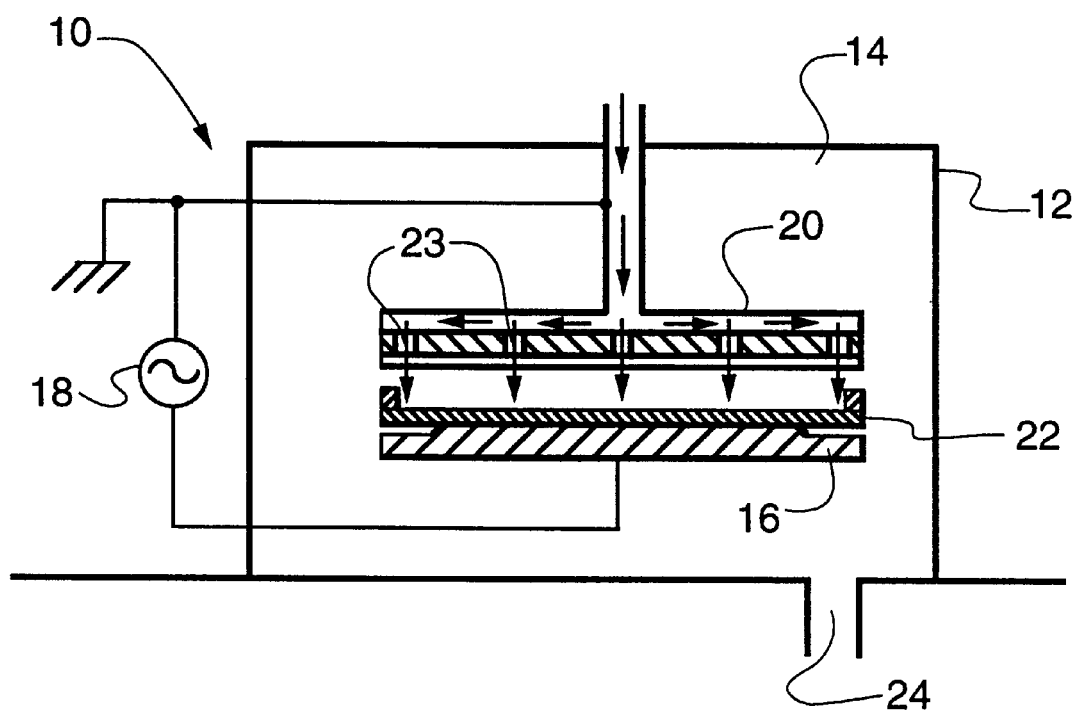
FIG. 1, shows in schematic representation a cross-sectional view of a conventional etch apparatus.

The present invention will next be illustrated with reference to FIG. 1. The FIGURE is intended to be illustrative, rather than limiting. It is included to facilitate the explanation of the apparatus used in performing the process of the present invention.

FIG. 1 is a cross-sectional view of a conventional etch chamber 10. A housing 12, made of aluminum for example, defines an etch chamber 14. The substrate 22 to be processed, such as a silicon wafer, is supported on an electrode support 16. The support 16 is typically the cathode. The interior walls of the housing 12 are typically the anode. The cathode 16 is connected to a source of RF power 18. A gas manifold 20 connected to a source of process gas (not shown) is opposite and closely spaced from the cathode support 16. The process gas is directed towards the substrate 22 as it exits the gas manifold 20 by orifices 23 in the gas manifold 20. When RF power is applied to the substrate support 16 and the process gases are fed to the manifold 20, a plasma is formed in the space between the manifold 20 and the substrate 22. An exhaust line 24 connected to a vacuum pump (not shown) maintains the pressure in the chamber and evacuates spent gases and reaction products.

Generally, when a fluorocarbon etch gas, such as $CF_4$, $C_2F_6$, $C_3F_8$, $CH_2F_4$, and the like, that contains both carbon and fluorine is exposed to a plasma, various fragments are generated in the plasma. Such fragments include free fluorine atoms, CF and $CF_2$ radicals, and the like. The fluorine is available to etch silicon oxide layers on a substrate. During the course of the etch process, however, a polymer of carbon and fluorine is also formed that deposits on the substrate, forming a passivating layer. Such polymers are attacked by oxygen atoms, and thus the oxygen atoms from the oxide layer will dissociate the polymer as it is formed, without interfering with the etch of the oxide layer. When no oxygen is present, however, such as when a non-oxygen-containing layer is reached, i.e., a nitride layer, there is no oxygen to dissociate the passivating polymer layer. At that point, the silicon oxide layer will continue being etched and the passivated nitride layer will etch at a slower rate.

Unfortunately, the passivating polymer is also dissociated by fluorine and the continual formation of fluorine ions in the plasma will bombard and otherwise attack the polymer layer. Such attack will cause the polymer to dissociate, whereupon the nitride layer will be etched by the plasma.

Attempts have been made to use an etch gas composed of $CHF_3$ and $HeO_2$, which also produces a passivating polymer on the nitride layer surface. This polymer buildup is not very uniform, resulting in a characteristically high center-to-edge non-uniformity of the etch rate on the etch stop nitride layer. The disparity in etch rate presents a significant problem during etching of the nitride layer in subsequent processing. Furthermore, when the nitride film is formed by plasma enhanced chemical vapor deposition, the non-uniformity of the etch rate is increased due to the ease of etching the nitride layer.

It has been discovered that etching with a plasma derived from a carbon and fluorine-containing gas and from a nitrogen-containing gas reduces the deficiencies mentioned above. Specifically, it has been found that etching a substrate having an oxide layer over a nitride layer using a plasma, derived from a carbon and fluorine-containing gas and from a nitrogen-containing gas, produces a $Si_xN_y$ species. This $Si_xN_y$ species, in which x=2, 3, or 4 and y=1, 2, 3, or 4, is generated by the reaction of $SiF_x$, an etch byproduct, with nitrogen radicals and ions, such as N, $N_2^-$, and $N^-$, when etching proceeds through the oxide layer to the nitride layer. (It is possible that several different $Si_xN_y$ species may be formed during a single process. For example, an $Si_2N_y$ species may be formed along with an $Si_3N_y$ species.) The $Si_xN_y$ species, preferably $Si_3N_4$, is the plasma precursor for nitride layers formed by chemical vapor deposition, and particularly plasma enhanced chemical vapor deposition. As a precursor, the $Si_xN_y$ species has an affinity for the nitride layer, thereby "sticking" to portions of the nitride layer which have been etched.

With the presence of $Si_xN_y$ in the etch plasma, the reverse process of nitride etch occurs: portions of the etched nitride layer are replaced with deposition of nitride. The nitride deposition process is substantially in equilibrium with the nitride layer etch process, yielding a high selectivity of the oxide layer to the nitride layer. The result is a reduction in the non-uniformity problems experienced with prior processes.

As used in this patent document, "oxide layer" refers to those oxide layers conventionally used in semiconductor fabrication, such as silicon dioxide, silane oxide, or tetraethylorthosilicate (TEOS) oxide. Similarly, "nitride layer" refers to those nitride layers conventionally used in semiconductor fabrication, such as silicon nitride. The present invention is also suitable for thin nitride layers having a thickness of less than about 200 angstroms.

In the present invention, the fluorocarbon etch gases used are preferably $CF_4$, $C_2F_6$, or combinations of those compounds. The nitrogen-containing gas is preferably $NH_3$, $N_2$, or combinations of those compounds. The process of the present invention can be conducted in those process chambers conventionally used, such as diode chambers or high-density plasma chambers. The etch chamber is powered by RF energy, which can be capacitively coupled into the plasma through the electrodes of the chamber. The RF energy can also be inductively coupled into the plasma through a chamber wall.

The following example is included to more clearly demonstrate the overall nature of the invention. This example is exemplary, and not restrictive, of the invention.

EXAMPLE

A silicon wafer having a silicon dioxide layer about 1000 angstroms thick over a silicon nitride layer about 200 angstroms thick, the silicon nitride layer being formed by plasma enhanced chemical vapor deposition, was etched in an RF etch chamber. The etch gas was composed of $CF_4$ and $N_2$ at a pressure of 160 mTorr. The source power was 800 W. A bias voltage of −550V, biased by RF energy of 13.56 MHz, was applied. The selectivity of the oxide layer over the nitride layer was 3:1.

Although illustrated and described above with reference to specific embodiments, the present invention is nevertheless not intended to be limited to the details shown. Rather, various modifications may be made in the details within the scope and range of equivalents of the claims and without departing from the spirit of the invention.

What is claimed is:

1. A process for etching an oxide layer placed over a nitride layer in an upper portion of a substrate with high etching selectivity for the oxide layer, the process comprising:

providing a plasma derived from a carbon and fluorine-containing gas and from a nitrogen-containing gas; and etching the substrate in the plasma in contact with the substrate, wherein the etching produces $SiF_4$, the plasma contains $Si_xN_y$ species derived from a reaction of $SiF_4$ and nitrogen species, and the $Si_xN_y$ species is deposited on the nitride layer substantially in equilibrium with the etching of the nitride layer.

2. The process of claim 1 wherein the substrate is silicon.

3. The process of claim 1 wherein the oxide layer is selected from the group consisting of silicon dioxide, tetraethylorthosilicate oxide, and silane oxide.

4. The process of claim 1 wherein the nitride layer is silicon nitride.

5. The process of claim 1 wherein the carbon and fluorine-containing gas is selected from the group consisting of $CF_4$, $C_2F_6$, and combinations of those compounds.

6. The process of claim 1 wherein the nitrogen-containing gas is selected from the group consisting of $N_2$, $NH_3$, and combinations of those compounds.

7. The process of claim 1 wherein the nitride layer has a thickness less than about 200 angstroms.

8. The process of claim 1 wherein:

the etching occurs in an etch chamber having electrodes; and the process further comprises capacitively coupling RF energy into the plasma through the electrodes.

9. The process of claim 1 wherein:

the etching occurs in an etch chamber having a chamber wall; and the process further comprises inductively coupling RF energy into the plasma through the wall.

10. The process of claim 1 wherein the nitride layer is formed on the substrate by chemical vapor deposition.

11. An etch process selective to an oxide placed over a nitride, the process comprising the steps of:

exposing to a fluorocarbon-nitrogen plasma a substrate having an oxide layer placed over a nitride layer;

etching the oxide layer and the nitride layer to produce a $Si_xN_y$ species; and depositing the $Si_xN_y$ species on the nitride layer in substantial equilibrium with etching of the nitride layer.

12. The process of claim 11 wherein the substrate is silicon.

13. The process of claim 11 wherein the oxide layer is selected from the group consisting of silicon dioxide, tetraethylorthosilicate oxide, and silane oxide.

14. The process of claim 11 wherein the nitride layer is silicon nitride.

15. The process of claim 11 wherein the nitride layer has a thickness less than about 200 angstroms.

16. The process of claim 11 wherein:

the etching occurs in an etch chamber having electrodes; and the process further comprises capacitively coupling RF energy into the plasma through the electrodes.

17. The process of claim 11 wherein:

the etching occurs in an etch chamber having a chamber wall; and the process further comprises inductively coupling RF energy into the plasma through the wall.

18. The process of claim 11 wherein the nitride layer is formed on the substrate by chemical vapor deposition.

* * * * *